United States Patent [19]

Fliegel et al.

[11] Patent Number: 5,162,689
[45] Date of Patent: Nov. 10, 1992

[54] SINGLE-PHASE UNI-DIRECTIONAL ACOUSTIC WAVE TRANSDUCER

[75] Inventors: Frederick M. Fliegel, Tempe; David Penunuri, Fountain Hills; Thomas S. Hickernell, Tempe, all of Ariz.

[73] Assignee: Motorola, Inc., Schaumburg, Ill.

[21] Appl. No.: 694,516

[22] Filed: May 1, 1991

[51] Int. Cl.$^5$ .............................................. H01L 41/08
[52] U.S. Cl. ............................ 310/313 B; 310/313 A; 310/313 D; 310/313 R; 333/151; 333/154; 333/194
[58] Field of Search ........... 310/313 A, 313 B, 313 D, 310/313 R; 333/194, 151, 154

[56] References Cited

U.S. PATENT DOCUMENTS

| | | | |
|---|---|---|---|
| 3,882,433 | 5/1975 | Subramanian | 310/313 B |
| 4,072,915 | 2/1978 | Mitchell | 333/194 |
| 4,918,349 | 4/1990 | Shiba et al. | 310/313 B |
| 5,010,269 | 4/1991 | Hikita et al. | 310/313 B |
| 5,028,831 | 7/1991 | Maloda et al. | 310/313 B |

FOREIGN PATENT DOCUMENTS 0145214  8/1983  Japan ............................ 310/313 B

OTHER PUBLICATIONS

Unidirectional SAW Transducer with Meander and Interdigital Electrodes, by Y. Shimizu et al., Electronics and Communications in Japan, vol. 61-B, No. 7, 1978.

Primary Examiner—Mark O. Budd
Assistant Examiner—Thomas M. Dougherty
Attorney, Agent, or Firm—Frank J. Bogacz

[57] ABSTRACT

An acoustic transducer for an acoustic wave device which includes an acoustic wave propagating substrate, the transducer adapted to couple to an electrical load and/or source. The transducer includes at least a pair of comb electrodes formed on the substrate. It includes apparatus for applying an electrical load and/or source across the pair of comb electrodes. The first of the combs has a plurality of electrode fingers. The second comb has at least one electrode finger. The widths of the electrode fingers are the same. Gaps of at least two different widths are disposed between the electrodes.

26 Claims, 5 Drawing Sheets

SINGLE-PHASE UNI-DIRECTIONAL ACOUSTIC WAVE TRANSDUCER

CROSS-REFERENCE TO RELATED APPLICATION

The present application is related to co-pending U.S. patent application Ser. No. 504,506, which is assigned to the same assignee as the present invention.

1. Field of the Invention

The present invention generally relates to acoustic wave transduction and, more particularly, to uni-directional transduction of acoustic waves.

2. Background of the Invention

At the present time, much effort and expense is going into research and development relating to acoustic wave devices such as filters and delay lines for a variety of practical applications, and into acoustic charge transport (ACT) and Heterostructure ACT (HACT) devices which employ surface acoustic wave (SAW) transducers. Acoustic wave devices are becoming particularly important in the production of electronic signal processing equipment because they can be readily constructed on planar surfaces using integrated circuit fabrication techniques.

Unfortunately, conventional SAW transducers will reflect a SAW of reduced amplitude when a SAW signal is incident upon one of the acoustic ports of the transducer. This re-emitted wave will travel back to the transducer which originally emitted the incident SAW. When the re-emitted SAW is incident on the original SAW transducer, a third SAW of even further reduced amplitude is launched along same path as the first surface wave. The electrical signal which is manifested at the output electrical port of filters fabricated using such SAW devices due to this reflected and re-reflected acoustic energy is known as "triple transit" echo, owing to the fact that the energy comprising this signal has traversed the length of the SAW device three times. This triple transit echo gives rise to rippling in the SAW filter transfer function versus frequency.

As a result of this phenomenon, most SAW filters are designed to have an insertion loss of about twenty deciBells and so will suppress the triple transit echo by more than forty deciBells. This large filter insertion loss then limits application of SAW filters to those scenarios where such insertion losses, and the requirement for post-filtering amplification, are acceptable.

Uni-directional SAW transducers do not have the triple transit limitations of conventional SAW filters. A measure of the degree to which a transducer shows uni-directional transduction is the directivity, which is the ratio of the forward to reverse wave power levels, usually expressed in deciBells. A variety of techniques have been developed for achieving uni-directional SAW transduction. Several of the approaches utilize multi-phase transducers, wherein more than two electrode groups are electrically driven to simulate a travelling wave electrical potential. While these approaches do provide a high degree of directivity, the photolithographic requirements for their manufacture include multiple masking levels and crossovers involving airbridges. These are difficult to fabricate and result in reduced fabrication yields. The filters which include these multi-phase SAW transducers must also be hand-tuned in an iterative fashion to achieve the correct phasing of the SAW drive signals. This is a tedious step which further raises the costs associated with manufacturing the filter including multi-phase SAW transducers.

Alternative approaches include mass loading of every other finger in a split-finger transducer, group-type uni-directional transducers (a type of multi-phase transducer which does not require crossovers), and interdigitated interdigital transducers. The mass-loading method, wherein acoustic reflections are produced by the addition of stripes of dense material over selected electrodes, requires very precise alignment of the second masking level to the first masking level. Further, the material of choice for this mass loading approach is one which is very dense, such as gold or silver. When these materials have been tested for application to uni-directional transducers of this type, they have been found to introduce excessive acoustic propagation losses due to the viscous nature of these metals. Similarly, the other methods which have been developed to date involve compromises of frequency response, size, and so forth.

Further, when SAW transducers are employed in ACT devices, it is necessary to minimize the amount of acoustic power required in order to achieve bunching and transport of mobile charge carriers in the ACT device channel. A uni-directional SAW transducer results in a decrease by approximately one-half in the amount of power required to operate an ACT device. Prior art ACT devices have employed uni-directional SAW transducers which utilize a conventional bi-directional SAW transducer backed by a reflector array. Typically, the transducer is composed of a reflectionless array of electrodes and the reflector array is composed of electrodes having a second line-width.

This gives rise to several problems relating to second-order velocity shifts, heating of the SAW transducer, and the desire for high operating frequencies without requiring the narrow linewidths which such frequencies ordinarily imply. The temperature coefficient of delay (TCD) for GaAs is typical of the semiconductor materials which can support the ACT phenomenon. In the prior art approach, the transducer and the reflector array are physically separated, and so the heating of the transducer material results in a shift in velocity relative to the reflector array.

SUMMARY OF THE INVENTION

An acoustic wave transducer is used in an acoustic wave device. The acoustic wave transducer includes an acoustic wave propagating substrate. The transducer is adapted to coupling to an electrical load and/or source. The transducer has at least a pair of interdigitated comb electrodes formed on the substrate. The transducer has means for applying an electrical load and/or source across the pair of comb electrodes. A first comb of the pair has a plurality of electrode fingers. A second comb of the pair has at least one electrode finger. The widths of each electrode finger are the same throughout the transducer. Gaps of at least two different widths are disposed between the electrodes to provide a uni-directional acoustic wave transducer.

DETAILED DESCRIPTION OF THE PREFERRED EMBODIMENT

A broad variety of different acoustic eigenmodes have applications in microwave acoustic devices. These include surface acoustic waves (SAWs), or Rayleigh waves; surface skimming bulk acoustic waves (SSBAWs); shallow bulk acoustic waves (SBAWs); surface transverse waves (STWs); Stonely, Sezawa, Love, and other plate and higher order acoustic eigenmodes; longitudinal and shear bulk acoustic waves (BAWs); line acoustic waves (LAWs); and so on. For the purpose of convenience, the bulk of this discussion will be written in terms of surface acoustic waves as an example, with the understanding that the disclosure is applicable to the other varieties of acoustic propagation devices mentioned. The terms surface acoustic wave, acoustic wave, and surface wave or SAW, are employed interchangeably herein.

SAW devices operate at UHF and VHF frequencies, ranging from several tens of MegaHertz to well over a GigaHertz, where other types of planar signal processing elements operate with limited effectiveness.

These devices utilize interdigitated electrode combs made of thin-film metal which is vacuum deposited, for example by vacuum evaporation, on the top, polished surface of a material which is in whole or in part piezoelectric. The comb electrodes comprising the surface acoustic wave transducers are typically defined photolithographically, as is well known in the art.

Figure 1:
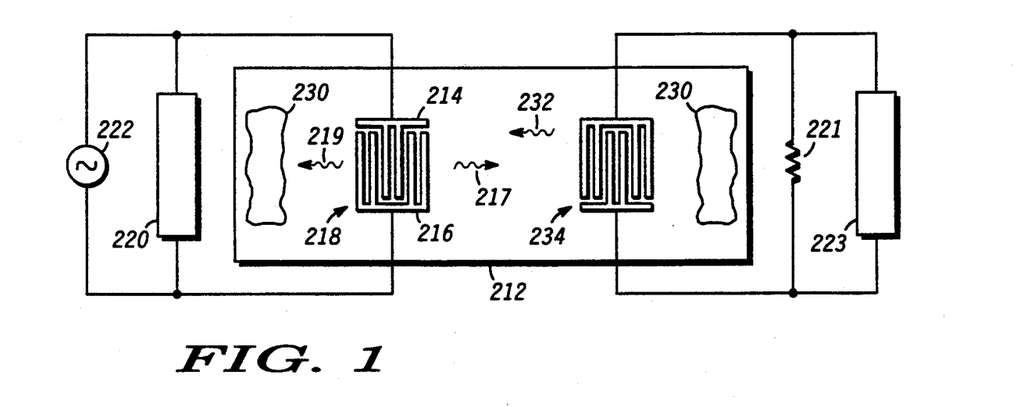
FIG. 1 (prior art) comprises a plan view of a prior art acoustic wave filter employing split-finger transducers.

The piezoelectric nature of the substrate material causes acoustic waves to be emitted from transducer 218 when it is excited by electrical signals from signal source 222 at appropriate frequencies, and conversely allow the output transducer 234 to manifest and communicate to load 221 an electrical output signal when an appropriate acoustic wave 217 is incident upon the transducer 234. This is a process which only occurs at selected frequencies, determined by the detailed design of transducers 218 and 234, thus forming the basis for a frequency selection filter.

As was previously mentioned, the triple transit echo gives rise to undesirable rippling in the surface acoustic wave filter transfer function versus frequency. The magnitude of the triple transit echo compared to the desired output signal amplitude is usually about one-fourth of the square of the filter insertion loss, or, mathematically, $$TTE = 6 \, dB + 2(IL)$$

where TTE denotes the magnitude of the suppression of the triple transit echo and IL represents the magnitude of the filter insertion loss, with both quantities expressed in deciBells.

The well-known prior art "split finger" SAW transducer 218, 234 configuration illustrated in FIG. 1 results in cancellation of the mechanical and electrical loading reflections from each electrode by the reflections associated with the nearest neighbor electrodes. The transducer 218 is composed of two interdigitated electrode combs 214 and 216, located on a piezoelectric substrate 212. The combs 214 and 216 are connected to a voltage source 222 and a matching circuit 220. The piezoelectric effect causes forward 217 and reverse 219 propagation of surface waves.

A receiving transducer 234 (constructed similarly to transducer 218) is illustrated, together with an electrical load 221, 223, composed of a reactance 223 and a conductance 221. The incident wave 217 causes an electrical signal to be delivered to the load, and also causes a reflected wave 232 to be emitted from the transducer 234.

The acoustic absorber 230 is placed on the crystal surface to absorb acoustic energy 219 emitted from the rear of the prior art transducer structures. This avoids unwanted artifacts in the resultant filter transfer function which can otherwise result from reflection of the energy 219 by the substrate edges. Alternative strategies for eliminating such reflections include cutting the crystal edges at an angle or employing uni-directional acoustic wave transducers. This latter approach obviates the reflection problem by minimizing or eliminating the unwanted acoustic wave 219.

Figure 2A:
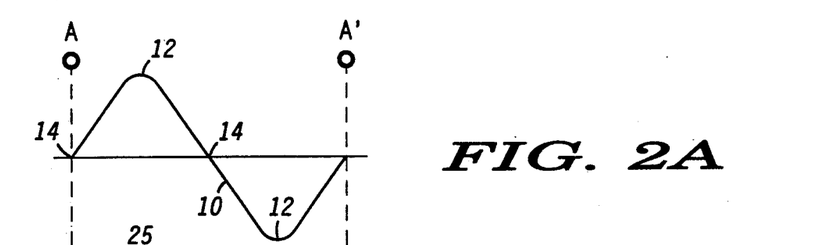
FIG. 2A is a diagram of a waveform of the electrical potential of a SAW.
Figure 2B:
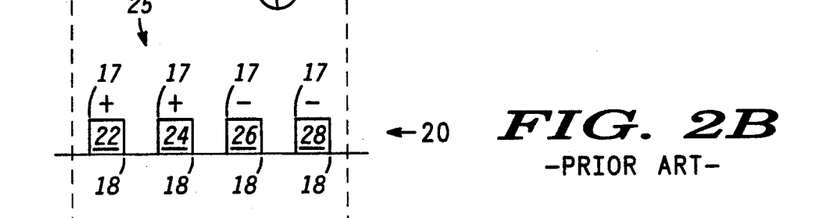
FIG. 2B (prior art) is a cross-sectional view of a prior art split finger SAW transducer.
Figure 2C:
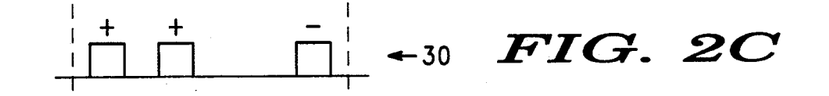
FIG. 2C is a cross-sectional view of a uni-directional split-finger transducer geometry.
Figure 2D:
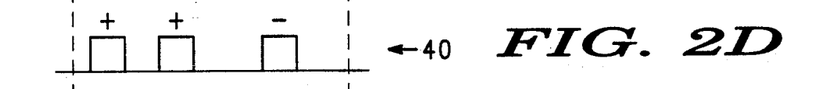
FIG. 2D is a cross-sectional view of a uni-directional split-finger transducer geometry.
Figure 2E:
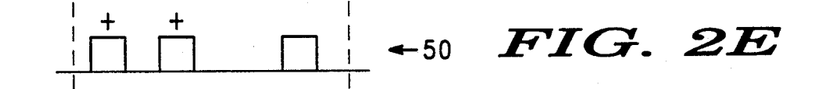
FIG. 2E is a cross-sectional view of a uni-directional split-finger transducer geometry.

Referring to FIG. 2A, the waveform 10 of a surface acoustic wave is represented, relative to cross-sectional views of split-finger SAW transducers in FIGS. 2B through 2K. The distance denoted between A and A' in all of FIGS. 2A through 2K defines the width of a unit cell 25 of the corresponding transducer; the overall transducer structure is comprised of a cascade of such unit cells 25, not all necessarily identical in terms of the configuration of the electrodes 22, 24, 26, and 28 within the unit cell 25 or even in the lengths of the unit cells 25. As shown in FIG. 2A, the length of the unit cell 25 is also the wavelength of the acoustic wave. In other configurations, for example FIGS. 2M and 2N, the wavelength and the unit cell 25 length may be dissimilar. FIG. 2C illustrates a split electrode configuration 30 with electrode 26 of FIG. 2B deleted. FIGS. 2D and 2E illustrate electrode 28 phase shifted by changing the position of electrode 28 within the unit cell 25.

This can be understood by observing that the rising, or for example, left hand edge 17 in FIG. 2B, of each electrode has the same sign and magnitude of acoustic reflection coefficient. As these edges 17 are separated by one-fourth of an acoustic wavelength, and as the acoustic wave travels that distance twice (once from the first edge to the second, and then once again back to the first edge) the reflection coefficient of the second electrode referenced to the first electrode is equal to that of the first electrode but is of opposite sign. Thus, these reflected waves sum to zero for the prior art electrode configuration given in FIGS. 1 and 2B. A similar observation holds for the reflections associated with the right hand electrode edges 18 in FIG. 2B; a desirable property of this arrangement is that the distances between left hand edges 17 or right hand edges 18 is independent of linewidth variations which may occur in the fabrication of the device, allowing the reflection cancellation achieved to be robust even in light of variations due to manufacturing tolerances.

Figure 2F:
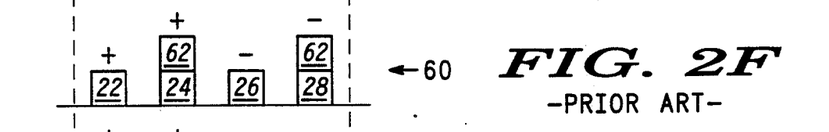
FIG. 2F (prior art) is a cross-sectional view depicting a prior art split-finger transducer.

Referring to FIG. 2F (prior art), a method whereby this cancellation process can be modified by adding extra material 62 to every other electrode 24 and 28 in unit cell 60 is shown, as described by Hartmann et al. (1982 IEEE Ultrasonics Symposium Proceedings, pp. 40–45, "An analysis of SAW interdigital transducers with internal reflections and the application to the design of single-phase unidirectional transducers," IEEE Catalogue No. 82CH1823-4). In this prior art, the added material is disposed asymmetrically with respect to the centers of transduction, which are ordinarily taken to be at the centroid of like-signed electrode groups, such as 22 and 24 or 26 and 28, corresponding, for example, to the extrema 12 of the acoustic wave phase, or at the centers of the gaps in between electrode groups with dissimilar signs, such as 24 and 26. These inter-electrode gaps correspond, for example, to the zeros 14 of the acoustic waveform 10, so as to produce acoustic reflections which combine with the surface wave transduction to produce a uni-directional SAW transducer 60. The material 62 is one which is chosen to have either mass or stiffness mismatch to the acoustic impedance of the substrate. Examples of dense materials often resulting in mass mismatch include gold, silver, osmium, and the like; materials which are extremely stiff, and so produce stiffness mismatch, include chromium and tungsten. Materials such as aluminum, which is flexible, has low density, and which is an excellent electrical conductor, are preferred for the electrodes 22, 24, 26, and 28.

Referring to FIG. 2C, a similar effect can be achieved by deleting any one of the electrodes 22, 24, 26, or 28 in a split-finger transducer such as those shown by electrode configurations 30, 40, or 50. The result of this is a gap whose width is three times that of any individual electrode in FIG. 2C. In FIG. 2D, the gaps are one electrode width and two electrode widths; in FIG. 2E, the gaps are one electrode width and non-integral multiples of an electrode width. This can be understood to be similar to a reflectionless split-finger transducer 20, superposed with an electrode whose reflection characteristics are the negative of those of the individual electrodes 22, 24, 26, or 28. As with the prior art mass-loading approach, the asymmetry required in order to provide directivity can be achieved by adjusting the relative phase, or, equivalently, the position within the unit cell 25, of the electrodes 22, 24, 26, or 28. Such adjustments are depicted in electrode configurations 40 and 50 in FIGS. 2D and 2E. FIG. 2E illustrates that that the phase adjustments may result in electrode positions which are aperiodic with respect to the other elements within unit cell 50. Measured data were taken for test structures constructed on 128° y-rotated, X-propagating $LiNbO_3$, with 15 finger pairs composed of 1900 Angstrom thick aluminum, having a linewidth of five micrometers and hence a wavelength of 40 micrometers. These test structures provided 2.07 dB of directivity for the electrode structure 30 depicted in FIG. 2C and 3.65 dB of directivity for the electrode structure 40 depicted in FIG. 2D, with the acoustic energy travelling to the left being dominant in both cases.

Figure 2G:
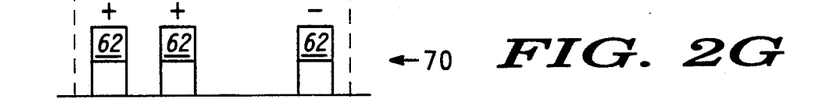
FIG. 2G is a cross-sectional view of a transducer wherein grooves are included in the interelectrode gaps.
Figure 2H:
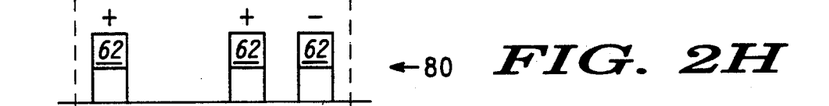
FIGS. 2H is a cross-sectional view of a transducer unit cell which incorporates more than one electrode width and which includes grooves.
Figure 2I:
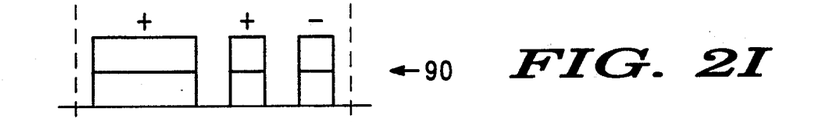
FIGS. 2I is a cross-sectional view of a transducer unit cell which incorporates more than one electrode width and which includes interelectrode grooves.
Figure 2J:
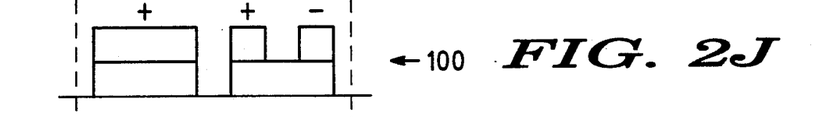
FIGS. 2J is a cross-sectional view of a transducer unit cell which incorporates more than one electrode width and which includes interelectrode grooves.
Figure 2K:
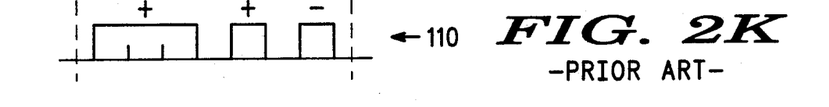
FIG. 2K (prior art) is a schematic diagram of a prior art uni-directional transducer structure.

The prior art structure 110 of FIG. 2K did not exhibit significant directivity (0.12 dB, with the energy to the right being dominant) for these same parameters. This indicates that an electrode of three eighths wavelength width has very low reflectivity for these conditions on this particular material, providing extremely poor directivity.

A related prior art method for achieving directivity 110 is depicted in FIG. 2K, wherein one of the electrodes 22, 24, 26, or 28 in the unit cell 25 of FIG. 2B has a modified width. This method is extensively discussed in U.S. Pat. No. 4,162,465, "Surface acoustic wave device with reflection suppression," by B. J. Hunsinger and K. Hanma, and in "Design of low-loss SAW filters employing distributed acoustic reflection transducers," by T. Kodama et al., 1986 IEEE Ultrasonics Symposium Proceedings, pp. 59–64.

The reflection cancellation obtained in the prior art split-finger transducer 20 of FIG. 2B is defeated by modifying the width of one or more of the electrodes in the unit cell 25 as shown by electrode configuration 110 in FIG. 2K.

In all of FIGS. 2G, 2H, 2I, and 2J, the transducer electrodes 70, 80, 90, and 100 are shown as being separated by gaps which include inter-electrode grooves extending into the substrate material to some depth. Such grooves significantly enhance acoustic reflections. The acoustic reflection coefficient is related to the depth of the groove. The depth required to provide a required acoustic reflection coefficient can be calculated from relationships which are well known in the art. FIGS. 2I and 2J show structures 90, 100 which employ multiple electrode widths together with inter-electrode grooves.

Figure 2L:
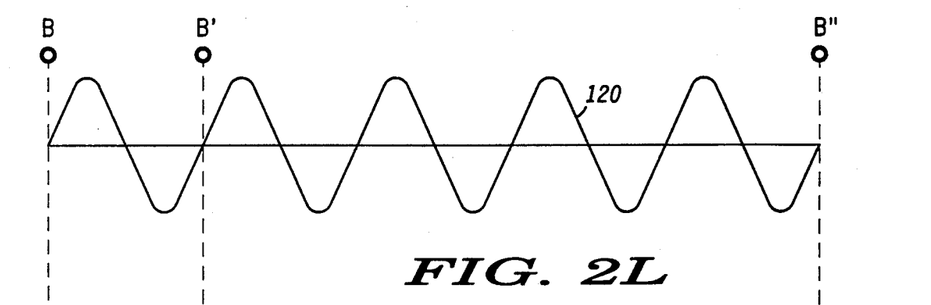
FIG. 2L again depicts several periods of an acoustic wave defining a unit cell.
Figure 2M:
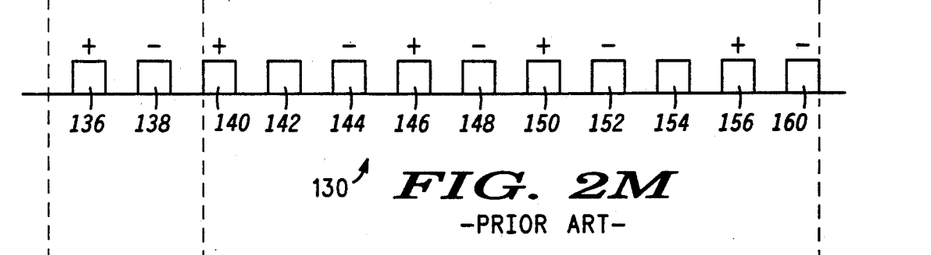
FIG. 2M (prior art) is a schematic of a unit cell of another type of prior art reflection-cancelling transducer structure.

Referring to FIG. 2M, a prior art example is provided in which one transducer period is five acoustic wavelengths long as shown by waveform 120 of FIG. 2L. Other ratios are possible as well. An advantage of this type of electrode finger structure 130 is that this allows for higher SAW frequencies of SAW device operation without the need for finer linewidths in the SAW transducer unit cell 130.

For example, the structure 20 depicted in FIG. 2B will allow a frequency of about 360 MHz when patterned onto a {100}-cut, <110>-propagating GaAs substrate using a one micrometer linewidth. The prior art structure 130 in FIG. 2M achieves approximately a 600 MHz center frequency with a one micrometer linewidth, for the same SAW substrate material and orientation, as mentioned above. Higher SAW frequencies are desirable because they enable larger signal bandwiths to be processed by the device. In the prior art electrode structure 130, the acoustic edge reflections occurring from electrode 136 cancel with those from electrode 142; the reflections from electrode 138 with those from 144; the reflections from electrode 140 with those from 146; and similarly for electrodes 148 to 160; with the same linewidth independence in manufacturing which was discussed in connection with the prior art split-finger transducer 20. Therefore, structure 130 possesses a similar robustness in light of manufacturing tolerances in fabrication. Again, selective deletion of strategically located electrodes allows that asymmetry, required for uni-directionality of transduction, to be established between the centers of reflection and the centers of transduction. One of many possible arrangements for achieving this is provided by the transducer structure 200 in FIG. 2N. Electrode fingers 144 and 156 of FIG. 2M have been eliminated in FIG. 2N to provide a uni-directional acoustic wave transducer. The common theme in the electrode arrangements provided in all of FIGS. 2C through 2E, 2G, 2H, and 2N is that the reflections introduced in a transducer structure by deletion of electrodes are introduced at a phase which is an odd multiple of 45 degrees from the zeros 14 or extrema 12 of the acoustic phase 10 of FIG. 2A. The electrode finger structures depicted in FIG. 2 may be combined in an acoustic wave transducer.

Figure 2N:
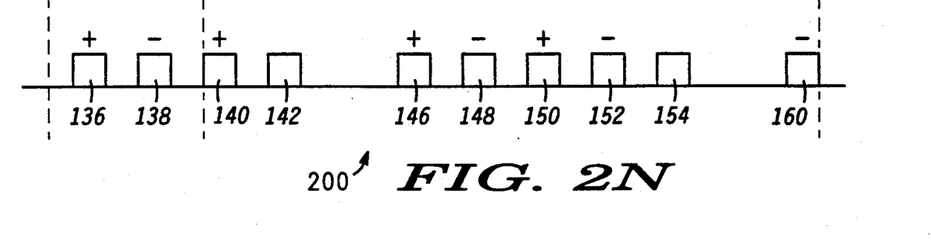
FIG. 2N is a schematic diagram which illustrates an electrode configuration to provide a uni-directional unit cell.

The unit cell 25 shown by lines A, A' of FIGS. 2B through 2K and by line B, B" of FIGS. 2M and 2N may be repeated an integral number of times for an acoustic wave transducer.

Figure 3:
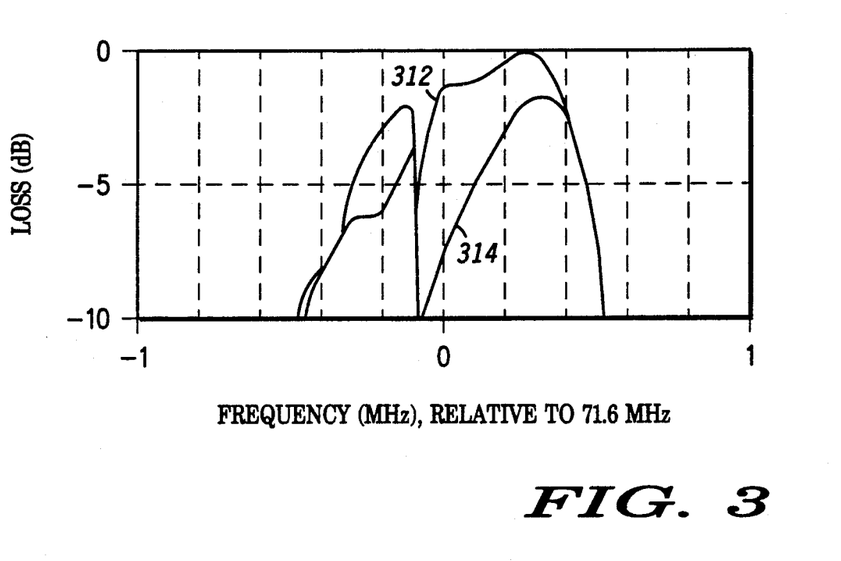
FIG. 3 is a graph of the measured forward (upper trace) and reverse (lower trace) acoustic power levels departing from a uni-directional SAW transducer for the configuration shown in FIG. 2K.
Figure 4:
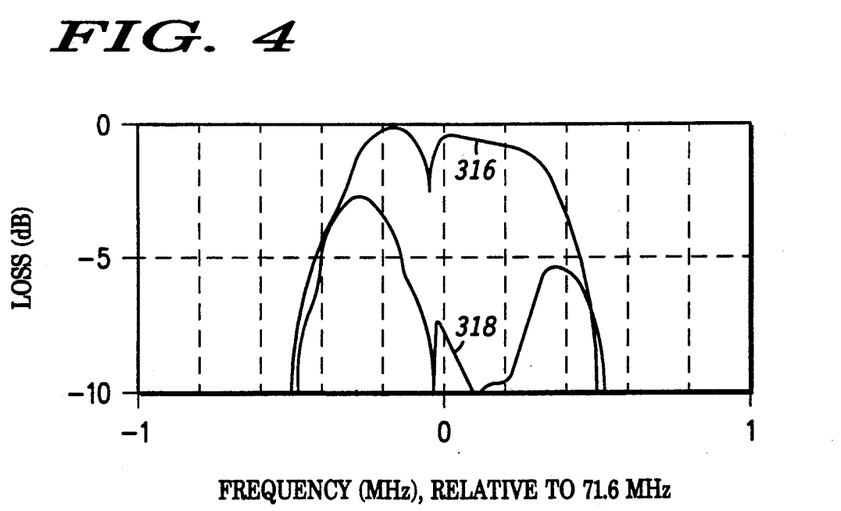
FIG. 4 is a graph of the measured forward (upper trace) and reverse (lower trace) acoustic power levels departing from a uni-directional SAW transducer for the configuration shown in FIG. 2H.

Responses from a transducer 70 of the type illustrated in FIG. 2G are given in FIG. 3. The forward wave amplitude 312 is some ten dB greater than the reverse wave amplitude 314, showing excellent directivity. FIG. 4 provides measured forward 316 and reverse 318 wave amplitudes for a transducer 80 of the type illustrated in FIG. 2H; again, about ten dB of directivity is observed.

Uni-directional acoustic wave transducers are employed in another class of bandpass filters known as "notch" filters. The unique input impedance versus frequency characteristics of uni-directional acoustic wave transducers lend them to use as impedance elements for this type of application. This is discussed at length in "Surface acoustic wave notch filters," by C. S. Hartmann, Jeffrey Charles Andle, and Michael Bosland King, IEEE 1987 Ultrasonics Symposium Proceedings, pp. 131-138, and in U.S. Pat. Nos. 4,599,587 and 4,577,168, both by Clinton Sylvester Hartmann. The disclosures of these patents are included herein by reference. In this utilization, only a single acoustic wave transducer is required on an acoustic wave substrate in order to form an impedance element. The impedance element is implemented by taking the acoustic wave filter of FIG. 1 employing at least one unidirectional acoustic wave transducer 218, deleting the lower connection of signal source 222 to transducer connection 216 and connecting the lower side of source 222 to ground, and taking the output signal between transducer connection 216 and ground. The acoustic waves 217 which are launched by transducer 218 at selected frequencies cause the impedance of the transducer 21, measured between connections 214 and 216, to be frequency dependent and so to form the basis of a notch filter.

The disclosure of U.S. Pat. No. 4,633,285 is hereby incorporated by reference.

Acoustic charge transport (ACT) devices are charge transfer devices which employ a surface acoustic wave to bunch mobile charge carriers, such as electrons, contained within a piezoelectric semiconductor material and then synchronously transport the resulting charge packets at the speed of sound.

Figure 5:
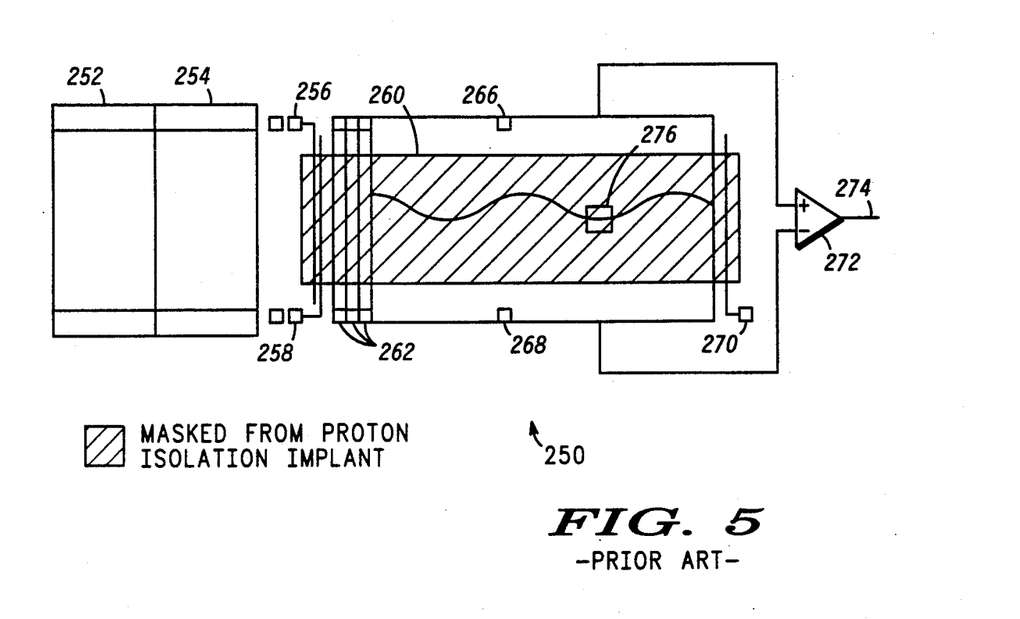
FIG. 5 (prior art) is a plan view of an acoustic charge transport device.

Most ACT devices employ substrate materials such as {100}-cut, <110>-propagating GaAs and the corresponding aluminum and indium alloys thereof. Referring to FIG. 5 (prior art), a plan view of an ACT device 250 is given. On substrate 288 in FIG. 6 (prior art), a cross sectional view of part of FIG. 5, from left to right in FIG. 5, the device 250 includes of a SAW reflector array 252, SAW transducer 254, input ohmic contact 256, input gate electrode 258, channel 260, isolation electrodes 262, a nondestructive sensing array (NDSA) composed of two electrode groups 268 and 266, a destructively sensing output electrode 270, and may include a differential amplifier 272, to provide an output port 274. The NDSA is composed of two groups 266 and 268 of electrodes, chosen to minimize their effect on the SAW.

Figure 6:
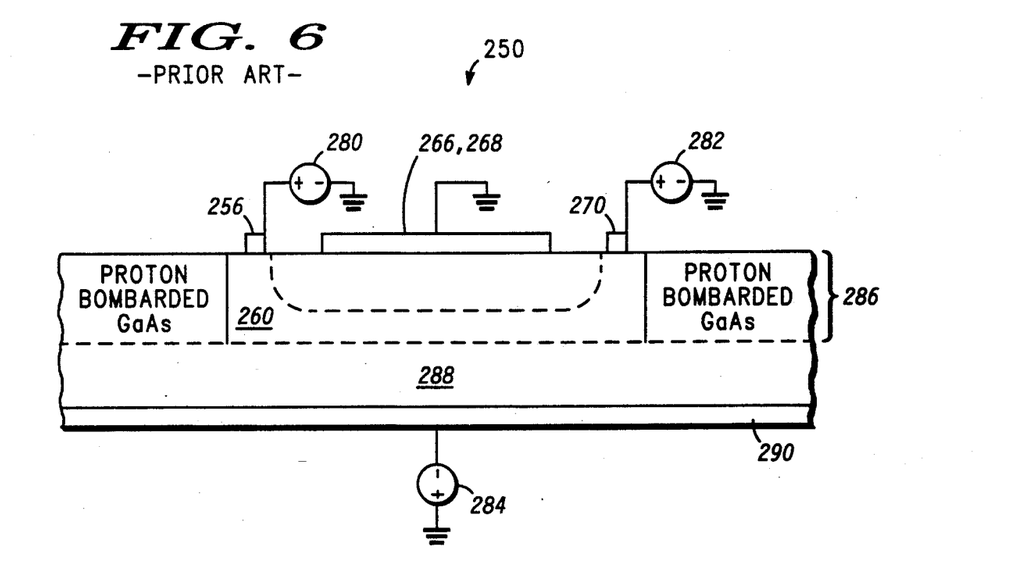
FIG. 6 (prior art) is a cross-sectional view of an acoustic charge transport device.

Mobile charge is injected by means of the ohmic input contact 256 into, and trapped within the extrema of, the propagating electrical potential associated with a SAW. In prior art ACT devices such as is illustrated in FIG. 5, a powerful, uni-directional single-frequency SAW is generated by the combined operation of the transducer 254, reflector 252, and an electrical signal source (not shown), when an appropriate excitation is supplied to the transducer 254 by the signal source. FIG. 6 is a cross section view of the ACT device of FIG. 5. The SAW travels from left to right as shown in FIGS. 5 and 6, from the transducer 254, past the ohmic input contact 256, through the channel 260, and then past the output contact 270. The channel 260 is composed of GaAs semiconductor material which has been depleted of mobile charge carriers by dc bias voltages 280, 282, and 284. These are shown in FIG. 6, which provides a cross-sectional view of an ACT device 250. In FIG. 6, a dc bias voltage 280 is shown applied to the ohmic input contact 256. Another dc bias voltage 282 forward-biases the Schottky barrier or ohmic output contact 270. This results in a reverse-biased Schottky barrier nondestructive sensing array 266, 268. An additional back-gating bias 284 is applied an ohmic contact 290 on the bottom of ACT device substrate 288. This back-gating bias depletes the channel of mobile carriers from the epilayer 286—substrate 288 interface upwards, towards the top surface of the epilayer 286. The ACT device channel 260 is electrically isolated from the rest of the device by a fabrication step which includes proton bombardment of the GaAs epitaxial layer 286 outside of the channel 260 area.

In operation of the device 250, mobile charge carriers are injected into the semiconductor channel 260 by RF voltage applied to the input contact 256. Here, they are gathered and transported within the electrical potential extrema of the powerful SAW. The high-frequency SAW is thus the sampling clock for the ACT device 250 in FIGS. 5 and 6. The injected charge samples are then transported at the SAW velocity, through the channel 260 and past the NDSA 264, and finally they are removed from the channel by means of a positive dc bias voltage 282 on the destructive output contact 270. The NDSA structure 266, 268 is capacitively coupled to the charge samples in the channel 260, forming the basis for a transversal filter. The desired filter response can be embedded in the NDSA structure 266, 268 by means of apodization of the electrode 276 lengths over the channel 260, or by means of other weighting techniques external to the device channel 260.

A disadvantage of many prior art structures which rely on a transducer 252 backed by a reflector 254 to achieve uni-directional transduction is that the transducer alone is heated by high electrical drive levels. This causes the transducer 252 and the reflector 254 to have different optimal frequencies of operation, due to the temperature coefficient of delay (TCD) of most practical SAW substrate materials. This is a particular problem for ACT and HACT devices as the transducer 252 structures employed in these devices tend to be large, owing to the extremely low piezoelectric coupling factor of these materials. In turn, because these tend to be long structures, they also tend to be very narrowband in terms of their electrical response. Hence any drift in frequency will have maximum impact on transducer 252, and subsequently device, performance. A table of TCDs for common substrate materials is given below.

TABLE 1

Temperature coefficients of delay for common substrates in parts per million per degree Centigrade.

| TCD | | Substrate Orientation |
| --- | --- | --- |
| 94 | LiNbO$_3$ | Y cut, Z propagating |
| 75 | | 128° rotated, X propagating |
| 35 | LiTaO$_3$ | Y cut, Z propagating |
| 64 | | 167° rotated |
| −24 | SiO$_2$ | Y cut, X propagating |
| 0 | | 42.5° rotated, X propagating |
| 0 | Li(BO$_3$)$_4$ | X cut, Z propagating |
| 0 | AlPO$_4$ | 84° rotated |
| 52 | GaAs | {100} cut, <110>-propagating |
| 120 | BiGeO$_{20}$ | {100} cut, <110>-propagating |

Figure 7:
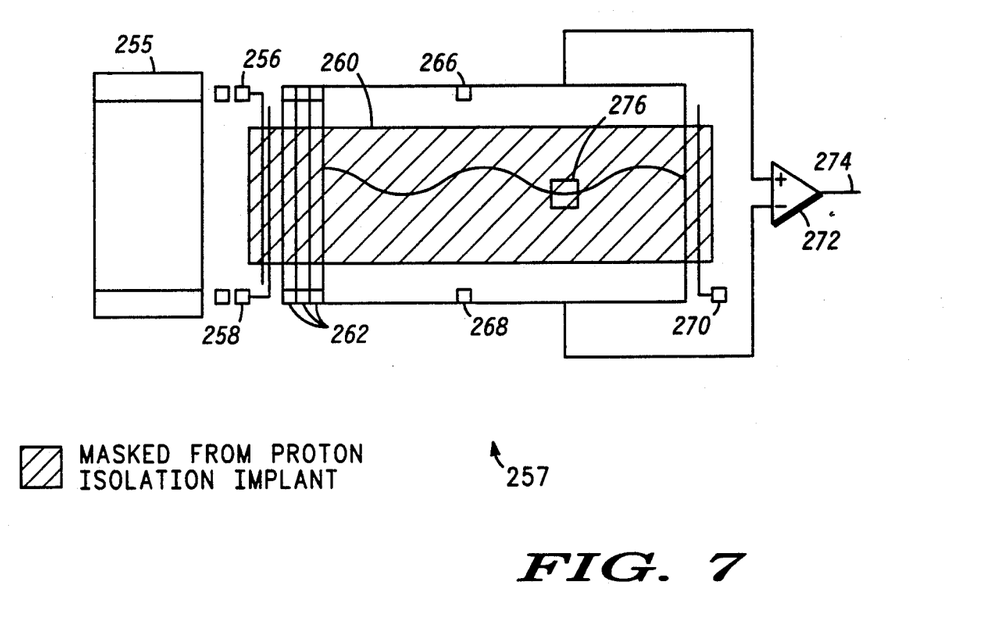
FIG. 7 is a plan view of an acoustic charge transport device, in accordance with the present invention.

Referring to FIG. 7, the application of single phase uni-directional acoustic wave transducer 255 to an ACT device 257 is illustrated. Transducer 255 is one of the kind of those described above in FIGS. 2C–2E, 2G–2J, and 2N. This allows elimination of reflector 252 from ACT device 250 in FIG. 5.

One advantage of the present invention is to provide single-phase uni-directional surface acoustic wave transducers which only require a single photolithographic masking level for their production.

Another advantage of the invention is to provide directivity of transduction while only requiring a single electrode width in the surface wave transducer.

The present invention provides a means of triple transit echo suppression in SAW filters by employing uni-directional transducer structures of the type disclosed herein.

The present invention is particularly advantageous in that temperature shifts caused by heating of the transducer due to electrical currents will also cause identical temperature, and hence surface wave velocity, shifts in the reflection function, because both transduction and reflection are occurring in the same physical space, in contrast to prior art. The present invention reduces the acoustic power requirements and requires less physical space on the surface of the semiconductor material.

The present invention is also advantageous in allowing for higher frequencies of single-phase uni-directional SAW transduction without resorting to finer geometries.

As can be appreciated in light of the preceding description, the present invention's advantage is to provide uni-directional SAW transducers which are easily fabricated by means of a single level photolithographic process with high yield, which are compact, robust in light of manufacturing variations, and which perform well over a broad variety of temperatures and power levels.

While the present invention has been described in terms of particular materials, structures, and steps, these choices are for convenience of explanation and not intended to be limiting; and, as those of skill in the art will understand based on the description provided herein, the present invention applies to other choices of materials, arrangements, and process steps, and it is intended to include in the claims that follow, these and other variations as will occur to those of ordinary skill in the art based on the present disclosure.

What is claimed is:

1. An uni-directional acoustic wave transducer for an acoustic wave device which includes an acoustic wave propagating substrate, said uni-directional acoustic wave transducer being adapted to coupling to an electrical load and/or source, said uni-directional acoustic wave transducer comprising:
   at least a pair of comb electrodes formed on said substrate;
   means for applying an electrical load and/or source across said pair of comb electrodes;
   a first of said pair of comb electrodes having a plurality of electrode fingers, the widths of said fingers being the same;
   a second of said pair of comb electrodes having at least one electrode finger, said at least one electrode finger being the same width as said electrode fingers of said first comb electrode; and
   gaps means including at least two different width gaps, said gap means disposed between said electrode fingers for asymmetrically displacing centers of reflection from centers of transduction, and providing a single phase uni-directional acoustic wave transducer which eliminates inter-transducer acoustic wave reflections.

2. An uni-directional acoustic wave transducer as claimed in claim 1, said gap means including a first gap between a first and a second of said electrode fingers of said first comb electrode and includes a second gap between said second electrode finger and a third electrode finger of said second comb electrode.

3. An uni-directional acoustic wave transducer as claimed in claim 2, wherein each of said electrode fingers of said first comb electrode being of a first height.

4. An uni-directional acoustic wave transducer as claimed in claim 3, wherein each of said electrode fingers of said second comb electrode being of a second height of approximately two times said first height.

5. An uni-directional acoustic wave transducer as claimed in claim 1, wherein said acoustic wave transducer includes a surface acoustic wave transducer.

6. An uni-directional acoustic wave transducer as claimed in claim 2, wherein said second gap is approximately two times the width of said first gap.

7. An uni-directional acoustic wave transducer as claimed in claim 2, wherein said first and second electrode fingers, said third electrode finger and said first and second gaps comprise a unit cell of an acoustic wavelength.

8. An uni-directional acoustic wave transducer as claimed in claim 7, wherein said unit cell means is repeated for any integral number of acoustic wavelengths.

9. An uni-directional acoustic wave transducer for an acoustic wave device which includes an acoustic wave propagating substrate, said uni-directional acoustic wave transducer being adapted to coupling to an electrical load and/or source, said uni-directional acoustic wave transducer comprising:
  at least a pair of comb electrodes formed on said substrate;
  means for applying said electrical load and/or source across said pair of comb electrodes;
  each of said comb electrodes having electrode fingers, the widths of said electrode fingers being the same;
  a first of said pair of comb electrodes including at least first and second electrode fingers;
  a second of said pair of comb electrodes including at least a third electrode finger; and
  gaps means including a first gap disposed between said first and said second electrode fingers and including a second gap disposed between second and third electrode fingers, said first and second gaps being different in width for asymmetrically displacing centers of reflection from centers of transduction to provide a uni-directional transducer which eliminated inter-transducer acoustic wave reflections.

10. An uni-directional acoustic wave transducer as claimed in claim 9, wherein said first, second and third electrode fingers and said first and second gaps comprise a unit cell means.

11. An uni-directional acoustic wave transducer as claimed in claim 10, wherein said unit cell means is repeated for any integral number of acoustic wavelengths.

12. An uni-directional acoustic wave transducer for an acoustic wave device which includes an acoustic wave propagating substrate, said uni-directional acoustic wave transducer being adapted to coupling to an electrical load and/or source, said uni-directional acoustic transducer comprising:
  at least a pair of comb electrodes formed on said substrate, said comb electrodes for converting electrical energy to acoustic energy and vice versa;
  means for applying said electrical load and/or source across said pair of comb electrodes;
  a first of said pair of said comb electrodes including at least first and second electrode fingers separated by a first gap, said first and second electrode fingers and said first gap for providing acoustic reflections in addition to converting electrical energy to acoustic energy and vice versa;
  a second of said pair of said comb electrodes including at least a third electrode finger, said third electrode finger separated from said second electrode finger by a second gap, said second gap being substantially equal to said first gap, said third electrode finger and said second gap for providing acoustic reflections in addition to converting between electrical and acoustic energy;
  said second and third electrode fingers being of a first width;
  said first electrode being a second width of approximately two times said first width and a width of said first gap; and
  groove means including a first groove located between said second and third electrode fingers and said first groove cut into said substrate to a predetermined depth, said groove means for enhancing acoustic reflections, said pair of comb electrodes, said first gap and said groove means separating centers of transduction and centers of reflection to provide a unidirectional transducer which eliminates inter-transducer reflected acoustic waves.

13. An uni-directional acoustic wave transducer as claimed in claim 12, wherein said groove means further includes a second groove located between said first and said second electrode fingers, said second groove cut into said substrate to said predetermined depth.

14. An uni-directional acoustic wave transducer for an acoustic wave device which includes an acoustic wave propagating substrate, said uni-directional acoustic wave transducer being adapted to couple to an electrical load and/or source, said uni-directional acoustic wave transducer comprising:
  at least a pair of comb electrodes formed on said substrate, said comb electrodes for converting electrical energy to acoustic energy to electrical energy;
  means for applying said electrical load and/or source across said pair of comb electrodes;
  each of said comb electrodes having a plurality of electrode fingers, the width of said electrode fingers the same;
  dummy electrode fingers;
  a first group of electrode fingers including at least two electrode fingers of said first comb electrode interleaved with at least two fingers of said second comb electrode followed by at least one dummy electrode finger, said first group of electrode fingers for providing acoustic reflections in addition to converting electrical energy to acoustic energy and vice versa;
  a second group of electrode fingers including at least two electrode fingers of said first comb electrode interleaved with at least two electrode fingers of said second comb electrode followed by at least one dummy electrode finger, said second group of electrode fingers for providing acoustic reflections in addition to converting electrical energy to acoustic energy and vice versa; and
  gap means including a first gap located between said dummy electrode finger of said first group and said electrode fingers of said second group and including a second gap located between each of said electrode fingers of said first and second comb electrodes and said dummy electrode fingers, said gap means for enhancing acoustic reflections within said uni-directional acoustic wave transducer, said first group of electrode fingers, said second group of electrode fingers, said gap means and said dummy electrode fingers cooperating so as to displace centers of transduction from centers of reflection to provide said uni-directional acoustic wave transducer.

15. An uni-directional acoustic wave transducer as claimed in claim 14, wherein said dummy electrode fingers of said first group are connected to said first comb electrode and said dummy electrode finger of said second group is connected to said second comb electrode.

16. An uni-directional acoustic wave transducer as claimed in claim 14, wherein said dummy electrode fingers of said first and second groups are connected to said first comb electrode.

17. An uni-directional acoustic wave transducer as claimed in claim 14, wherein said dummy electrode fingers of said first and second groups are connected to said second comb electrode.

18. In an acoustic charge transport (ACT) device on a substrate said ACT device comprising:
    channel means on said substrate;
    input means on said substrate, said input means providing charge to said channel means;
    said channel means for transporting said charge;
    output means on said substrate, said output means for receiving said charge; and
    acoustic wave transducer means on said substrate, said acoustic wave transducer means including:
        at least a pair of comb electrodes formed on said substrate;
        means for applying an electrical load and/or source across said pair of comb electrodes;
        a first of said pair of comb electrodes having a plurality of electrode fingers, the widths of said electrode fingers being the same;
        a second of said pair of comb electrodes having at least one electrode finger, said at least one electrode finger being the same width as said electrode fingers of said first comb electrode;
        gap means including at least two gaps of different widths, said at least two gaps disposed between said electrode fingers; and
    said acoustic wave transducer providing a single phase uni-directional propagating acoustic wave and eliminating acoustic wave reflections.

19. In an ACT device as claimed in claim 18, wherein:
    said plurality of electrode fingers of said first comb electrode includes a first and second electrode fingers; p1 said at least one electrode finger includes a third electrode finger; and
    said gap means includes a first gap separating said first and second electrode fingers and includes a second gap separating said second and third electrode fingers.

20. In an ACT device as claimed in claim 18, wherein said first, second and third electrode fingers and said first and second gaps comprise a unit cell of an acoustic wavelength.

21. In an ACT device as claimed in claim 20, wherein said unit cell is repeated for any integral number of wavelengths.

22. In an ACT device as claimed in claim 19, wherein the width of said second gap is at least two times greater than the width of said first gap.

23. In an ACT device as claimed in claim 19, wherein a width of said first gap is at least two times greater than the width of said second gap.

24. In an ACT device as claimed in claim 19, wherein the width of said first and second gaps is approximately equal.

25. In an acoustic wave filter on an acoustic wave substrate, said filter including at least one unidirectional acoustic wave transducer located on an end of said acoustic wave substrate, said filter comprising:
    input means, said input means providing an input signal;
    acoustic wave substrate means; and
    unidirectional acoustic wave transducer means on said acoustic wave substrate means, said unidirectional acoustic wave transducer means including:
        at least a pair of comb electrodes formed on said substrate;
        a first comb electrode of said pair of comb electrodes having a plurality of electrode fingers, said first comb electrode connected to said input means, the widths of said electrode fingers being the same;
        a second comb electrode of said pair of comb electrodes having at least one electrode finger, said at least one electrode finger being the same width as said electrode fingers of said first comb electrode;
        gap means including at least two gaps of different widths, said at least two gaps disposed between said electrode fingers so as to asymmetrically displace centers of reflection from centers of transduction to provide a unidirectional acoustic wave transducer; and
    output means disposed on said acoustic wave substrate means, said output means providing an output signal being a filtered version of said input signal.

26. In an acoustic wave filter as claimed in claim 25, wherein there is further includes:
    second acoustic wave transducer means located on an opposite end of said acoustic wave substrate means from said first acoustic wave transducer means, said second acoustic wave transducer means including:
        at least a pair of comb electrodes formed on said substrate;
        a first of said pair of comb electrodes having a plurality of electrode fingers, the widths of said electrode fingers being the same;
        a second of said pair of comb electrodes having at least one electrode finger, said at least one electrode finger being the same width as said electrode fingers of said first comb electrode;
        gap means including at least two gaps of different widths, said at least two gaps disposed between said electrode fingers, so as to asymmetrically displace centers of reflection from centers of transduction to provide a unidirectional acoustic wave transducer; and
    said second acoustic wave transducer means providing a filtered version of said input signal.

* * * * *